(12) United States Patent
Suzuki (10) Patent No.: US 9,865,838 B2
(45) Date of Patent: Jan. 9, 2018

(54) DISPLAY DEVICE HAVING A BENT PORTION

(71) Applicant: Japan Display Inc., Tokyo (JP)

(72) Inventor: Takayasu Suzuki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/067,548

(22) Filed: Mar. 11, 2016

(65) Prior Publication Data
US 2016/0268542 A1 Sep. 15, 2016

(30) Foreign Application Priority Data

Mar. 12, 2015 (JP) .................................. 2015-049706

(51) Int. Cl.
| | |
|---|---|
| *G09G 5/00* | (2006.01) |
| *H01L 51/52* | (2006.01) |
| *H01L 27/32* | (2006.01) |
| *G06F 3/041* | (2006.01) |
| *H01L 51/00* | (2006.01) |
| *G06F 1/16* | (2006.01) |

(52) U.S. Cl.
CPC .......... *H01L 51/5246* (2013.01); *G06F 3/041* (2013.01); *H01L 27/323* (2013.01); *H01L 27/3276* (2013.01); *H01L 51/0097* (2013.01); *H01L 51/5212* (2013.01); *H01L 51/5228* (2013.01); *H01L 51/5253* (2013.01); *G06F 1/1652* (2013.01); *G09G 2380/02* (2013.01); *H01L 2251/5338* (2013.01); *Y02E 10/549* (2013.01)

(58) Field of Classification Search
CPC ... G06F 1/1652; G06F 3/041; H01L 51/5246; H01L 27/3276; H01L 51/5253; H01L 51/0097; H01L 51/5212; H01L 51/5228; Y02E 10/549
USPC ............................................................ 345/4
See application file for complete search history.

(56) References Cited

U.S. PATENT DOCUMENTS

| | | | | |
|---|---|---|---|---|
| 2014/0295150 | A1* | 10/2014 | Bower | ............... G02F 1/133305 428/201 |
| 2016/0179229 | A1* | 6/2016 | Ahn | ........................ G06F 3/041 345/173 |
| 2016/0224066 | A1* | 8/2016 | Hussa | .................... G06F 1/1652 |
| 2016/0231837 | A1* | 8/2016 | Baek | ........................ G06F 3/044 |

FOREIGN PATENT DOCUMENTS

JP 2003-280542 A 10/2003

* cited by examiner

*Primary Examiner* — Adam J Snyder
(74) *Attorney, Agent, or Firm* — Typha IP LLC (57) ABSTRACT

A display device includes: a TFT substrate; a counter substrate; a flat bonding member bonding the TFT substrate and the counter substrate at a display area and an additional function area; and a bent bonding member bonding the TFT substrate and the counter substrate at a peripheral area outside the display area and a peripheral area outside the additional function area, the bent bonding member including a bonding interface at which a shear stress occurs due to the bending of the TFT substrate and the counter substrate. The bent bonding member has a deformation allowance in a direction of the shear stress greater than that of the flat bonding member.

7 Claims, 6 Drawing Sheets

DISPLAY DEVICE HAVING A BENT PORTION

CROSS-REFERENCE TO RELATED APPLICATION

The present application claims priority from Japanese application JP2015-049706 filed on Mar. 12, 2015, the content of which is hereby incorporated by reference into this application.

BACKGROUND OF THE INVENTION

1. Field of the Invention

The present invention relates to a display device.

2. Description of the Related Art

A display device includes an image display substrate including a display area provided with an image display function, a counter substrate provided to face the image display substrate, and a flexible wiring board electrically connected to the image display substrate. The flexible wiring board is joined to an edge portion of the image display substrate. In such a display device, a configuration has been known in which the flexible wiring board is bent to realize the miniaturization of the device, as disclosed in, for example, JP 2003-280542 A.

Here, it is expected to further miniaturize the display device while ensuring the size of the display area. Moreover, when an edge portion of the substrate of the display device is bent to achieve the miniaturization, it is desirable that a strain occurring in the bent portion is small.

SUMMARY OF THE INVENTION

In view of the problem described above, it is an object of the invention to provide a display device capable of reducing a strain occurring in a bent portion while realizing the miniaturization of the display device.

A display device according to an aspect of the invention includes: a first substrate having flexibility and including a display area provided with an image display function and a first peripheral area located outside the display area, the first substrate being bent in the first peripheral area; a second substrate having flexibility and including an additional function area provided with a function added to the image display function and a second peripheral area located outside the additional function area, the second substrate being bent in the second peripheral area in the same direction as the bending of the first peripheral area; a first flat bonding member bonding the first substrate and the second substrate together at the display area and the additional function area; and a first bent bonding member bonding the first substrate and the second substrate together at the first peripheral area and the second peripheral area, the first bent bonding member including a bonding interface at which a shear stress occurs due to the bending of the first substrate and the second substrate, wherein the first bent bonding member has a deformation allowance in a direction of the shear stress greater than that of the first flat bonding member. In the display device according to the aspect of the invention, since the deformation allowance of the first bent bonding member in the direction of the shear stress is great, a stress at the bonding interface in the bent portion of the display device is relieved. As a result, a strain occurring in the bent portion of the display device is reduced.

DETAILED DESCRIPTION OF THE INVENTION

Hereinafter, embodiments of the invention will be described with reference to the drawings.

Figure 1:
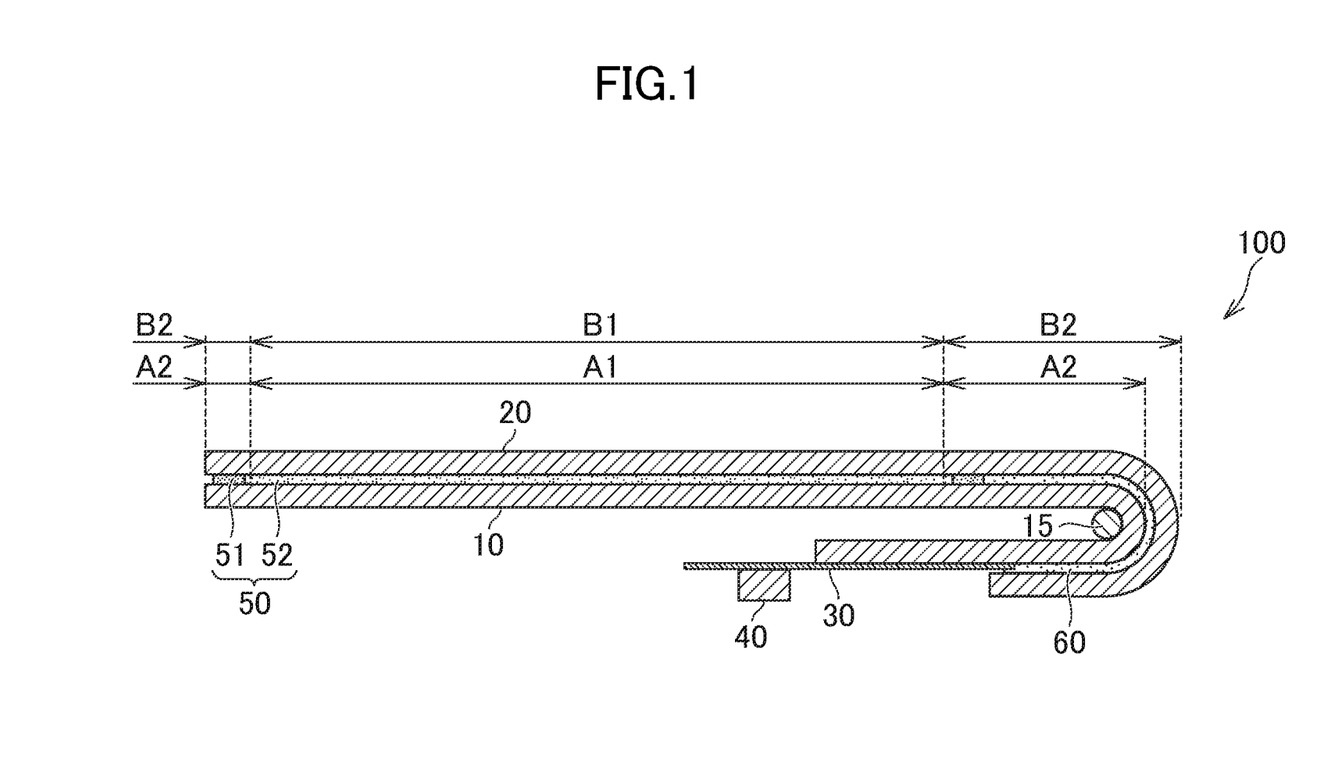
FIG. 1 is a cross-sectional view schematically showing a display device according to a first embodiment.
Figure 2:
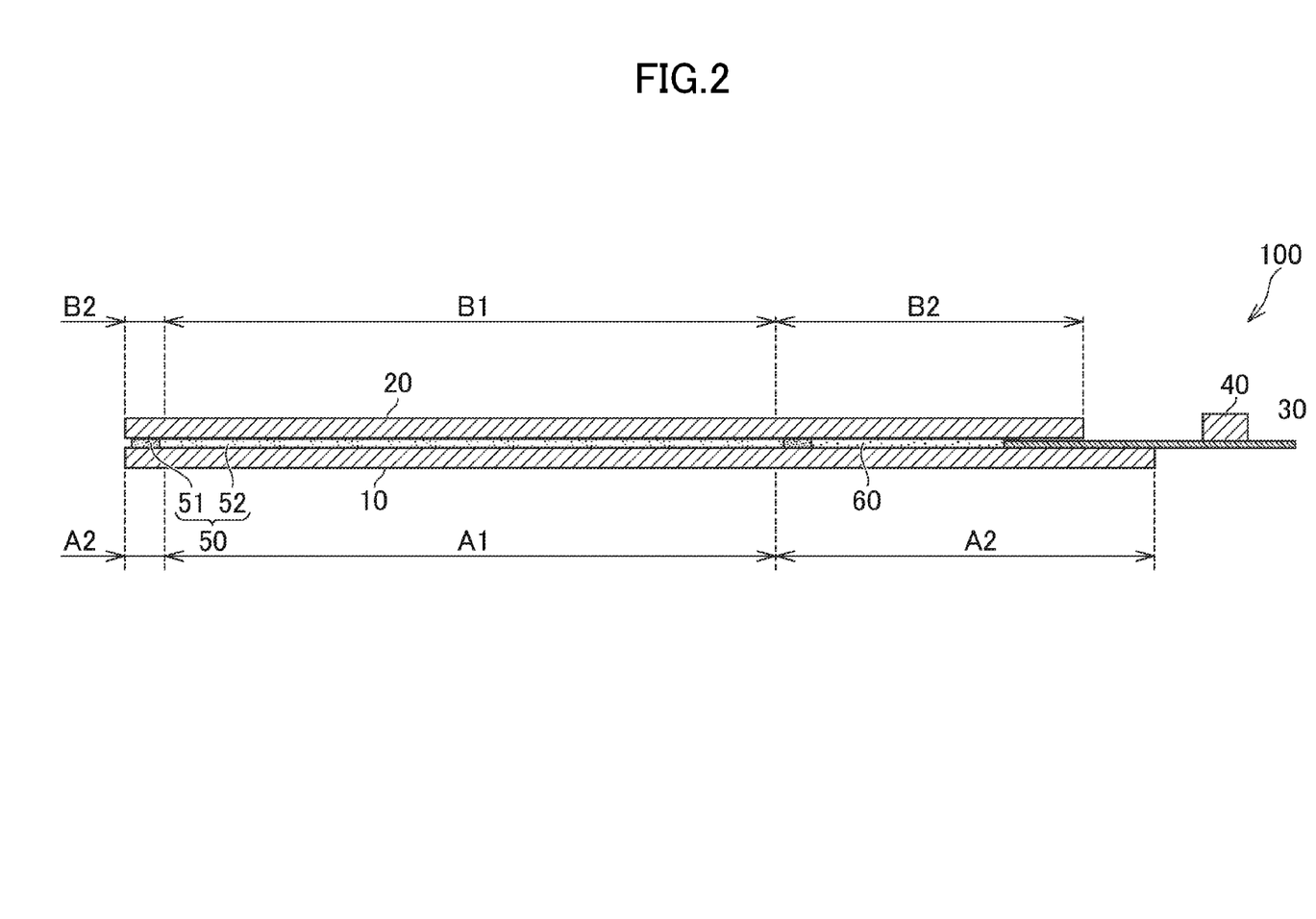
FIG. 2 is a cross-sectional view schematically showing the display device according to the first embodiment, showing a state before bending a TFT substrate and a counter substrate.

First, the configuration of a display device according to a first embodiment of the invention will be described with reference to FIGS. 1 and 2. FIG. 1 is a cross-sectional view schematically showing the display device according to the first embodiment, cut along a plane parallel to a longitudinal direction of a thin film transistor (TFT) substrate. A paper surface direction of FIG. 1 is defined as a transverse direction of the TFT substrate 10, while a direction orthogonal to the transverse direction is defined as the longitudinal direction of the TFT substrate 10. FIG. 2 is a cross-sectional view schematically showing the display device according to the first embodiment, showing a state before bending the TFT substrate and a counter substrate.

As shown in FIG. 1, a c 100 includes the TFT substrate 10 as a first substrate, a counter substrate 20 as a second substrate, and a flexible wiring board 30 as a first flexible wiring board.

The TFT substrate 10 is a substrate including a TFT circuit layer, an organic electroluminescence (EL) layer whose light emission is controlled by the TFT circuit layer, and a sealing layer covering the organic EL layer and made of an inorganic insulating material. The TFT substrate 10 has flexibility and a substantially rectangular planar shape.

Moreover, the TFT substrate 10 includes a c A1 provided with an image display function and a peripheral area A2 as a first peripheral area located outside the display area A1. In the display area A1, thin film transistors and display elements are provided. Moreover, the TFT substrate 10 includes, in the peripheral area A2, a terminal (not shown) for external electrical connection.

The counter substrate 20 includes an additional function area B1 provided with a function added to the image display function of the TFT substrate 10, and a peripheral area B2 as a second peripheral area located outside the additional function area B1. For example, the counter substrate 20 includes a color filter substrate having, as an additional function, a function of allowing transmission of a specific wavelength color and blocking transmission of other wavelength colors.

The flexible wiring board 30 is a board composed of a base material including an insulating resin material and a conductive metal bonded together, and including an electric circuit. The flexible wiring board 30 is joined to an edge portion of the TFT substrate 10 in the longitudinal direction, and electrically connected to the terminal of the TFT substrate 10. The flexible wiring board 30 receives a signal for controlling the image display function provided in the TFT substrate 10. An integrated circuit (IC) 40, as an electronic component, is mounted on the flexible wiring board 30 and located further to the area where the flexible wiring board 30 is joined to the TFT substrate 10 than to the opposite side, in the longitudinal direction, of the area where the flexible wiring board 30 is joined to the TFT substrate 10.

The TFT substrate 10 and the counter substrate 20 are bonded together at the display area A1 and the additional function area B1 with a flat bonding member 50 as a first flat bonding member. The flat bonding member 50 includes a sealing material 51 surrounding the display area A1 and the additional function area B1, and a filling material 52 provided in an area surrounded by the sealing material 51. The flat bonding member 50 adheres to or bonds the TFT substrate 10 and the counter substrate 20 together, so as to maintain the relative positions of the TFT substrate 10 and the counter substrate 20.

The display area A1 and the additional function area B1 are provided at positions overlapping each other, and both have a substantially rectangular planar shape. The sealing material 51 is formed so as to surround the peripheries of the display area A1 and the additional function area B1. The filling material 52 is positioned in an area overlapping the display area A1 and the additional function area B1. As the sealing material 51, for example, a dam material is used.

The TFT substrate 10 is bent in the first peripheral area A2 and in a direction opposite to the counter substrate 20. The counter substrate 20 is bent in the second peripheral area B2 and in the same direction as the bending of the TFT substrate 10.

The display device 100 includes a guide 15 having a curved surface along the bending of the TFT substrate 10. The guide 15 is a tubular or cylindrical member extending in a direction parallel to the transverse direction of the TFT substrate 10. The TFT substrate 10 and the counter substrate 20 are changed from a state where the TFT substrate 10 and the counter substrate 20 are unbent as shown in FIG. 2 to a state where the TFT substrate 10 and the counter substrate 20 are bent using the guide 15 as shown in FIG. 1, so that it is possible to suppress the deflection or the like of the substrates and thus maintain a preferred shape.

By employing the configuration in which the TFT substrate 10 and the counter substrate 20 are bent, a part of the peripheral area A2 existing on the same plane as the display area A1 can be reduced, and thus it is possible to realize a narrower picture-frame of the display device 100. As a result, it is possible to realize the miniaturization of the display device 100 while ensuring the size of the display area A1.

At the peripheral area A2 and the peripheral area B2 including bent port ions of the TFT substrate 10 and the counter substrate 20, the TFT substrate 10 and the counter substrate 20 are bonded together by a bent bonding member 60 as a first bent bonding member. The TFT substrate 10 and the counter substrate 20 are bent in a state where the peripheral area A2 and the peripheral area B2 are bonded together by the bent bonding member 60. As shown in FIGS. 1 and 2, the bent bonding member 60 is provided so as to cover a portion of a connecting portion of the flexible wiring board 30 to the terminal of the TFT substrate 10.

Here, a shear stress occurs at a bonding interface of the bent bonding member 60 to the bent portion of the TFT substrate 10 and at a bonding interface of the bent bonding member 60 to the bent portion of the counter substrate 20. Directions of shear stresses, occurring at the bonding interfaces facing each other, are opposite. Such shear stresses cause a strain in the bent portion of the display device 100.

In the display device 100 according to the first embodiment, therefore, the bent bonding member 60 is configured so as to allow the deformation thereof in a direction of the shear stress. A stress at the bonding interface is relieved by an amount corresponding to the deformation of the bent bonding member 60 in association with the bending of the TFT substrate 10 and the counter substrate 20, and therefore, a strain occurring in the bent portion of the display device 100 is reduced. Specifically, in the first embodiment, the bent bonding member 60 is configured such that the deformation allowance thereof in the direction of the shear stress is greater than that of the flat bonding member 50.

The configuration of the bent bonding member 60 will be described in detail with reference to FIGS. 3A to 3C and FIGS. 4A and 4B. The configuration of the bent bonding member described herein is an example of the invention, and other configurations may be employed as long as the deformation allowance of the bent bonding member in the direction of the shear stress is greater than that of the flat bonding member.

Figure 3A:
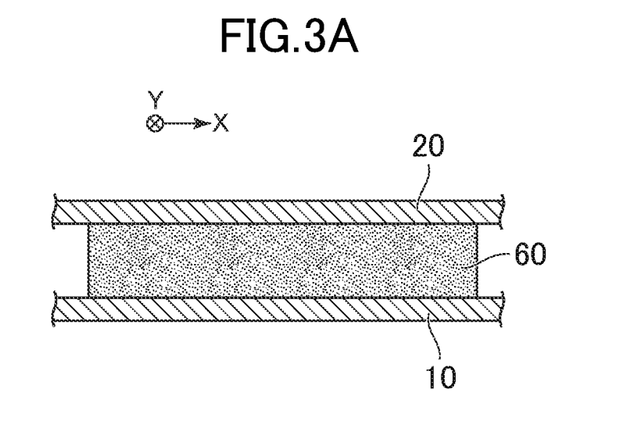
FIG. 3A is a cross-sectional view showing an example of the configuration of a bent bonding member.
Figure 3B:
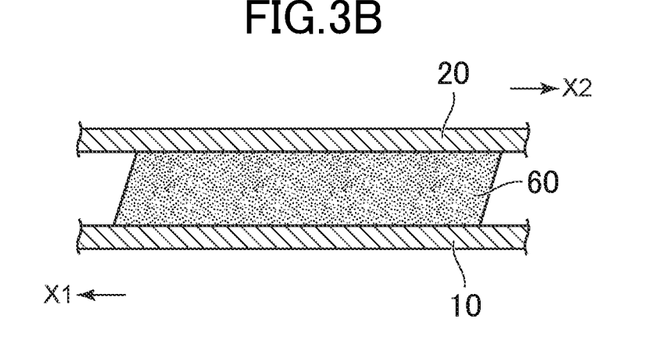
FIG. 3B is a cross-sectional view showing an example of the configuration of the bent bonding member.
Figure 3C:
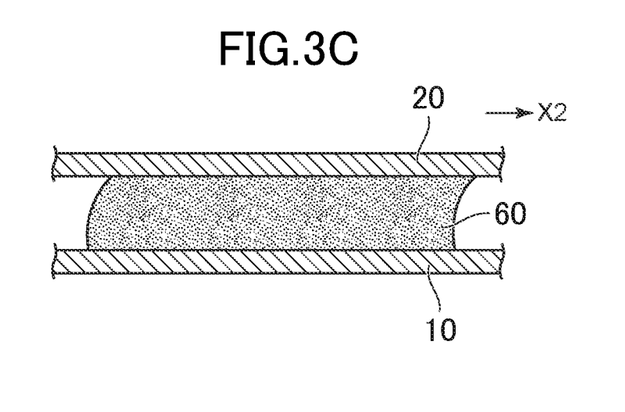
FIG. 3C is a cross-sectional view showing an example of the configuration of the bent bonding member.

FIGS. 3A to 3C are cross-sectional views showing examples of the configuration of the bent bonding member, for explaining deformation of the bent bonding member. A "bonding member having a low viscosity" in the following description indicates a bonding member made of a material having a viscosity lower than that of a material of the flat bonding member 50, and having a great deformation allowance.

Figure 4A:
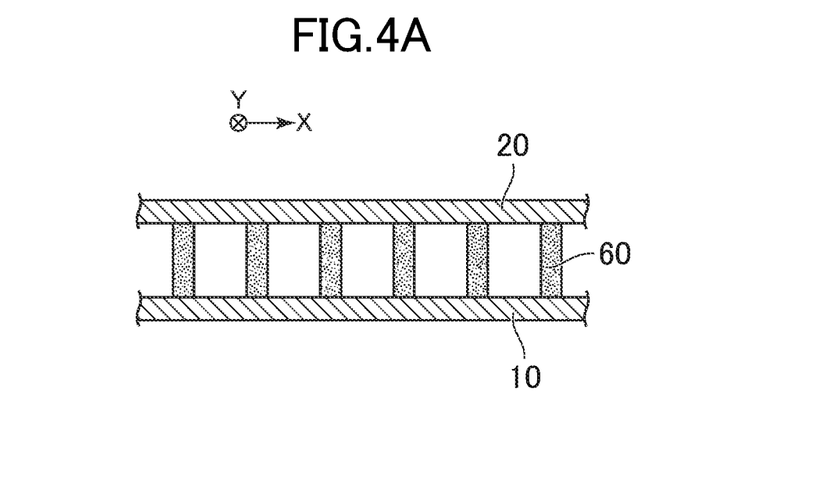
FIG. 4A is a cross-sectional view showing an example of the configuration of the bent bonding member.
Figure 4B:
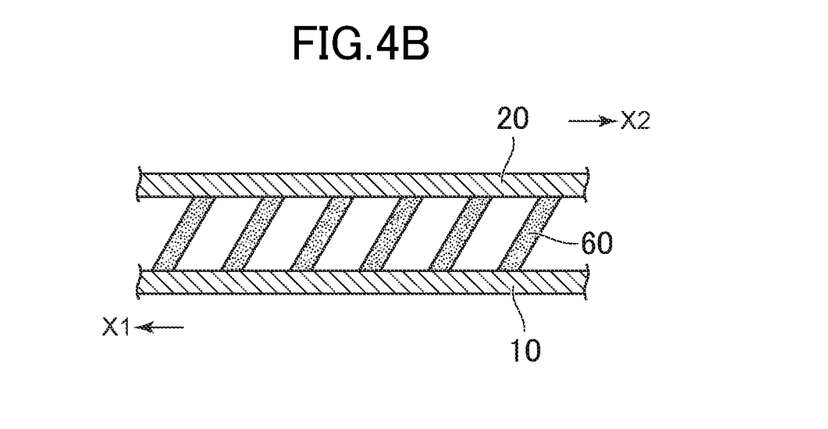
FIG. 4B is a cross-sectional view showing an example of the configuration of the bent bonding member.

FIGS. 3A to 3C, and FIGS. 4A and 4B described later schematically show selected portions of the configurations of the bent portions in the peripheral area A2 of the TFT substrate 10 and the peripheral area B2 of the counter substrate 20, and the bent bonding member 60. FIGS. 3A and 4A show a state before bending the TFT substrate 10 and the counter substrate 20, in which the bent bonding member is not deformed. FIGS. 3B, 3C, and 4B show a state after bending the TFT substrate 10 and the counter substrate 20, in which the bent bonding member is deformed.

The bent bonding member 60 shown in FIGS. 3A to 3C is continuously applied between the peripheral area A2 of the TFT substrate 10 and the peripheral area B2 of the counter substrate 20, so as to bond the TFT substrate 10 and the counter substrate 20 together. That is, the bent bonding member 60 is continuously provided in both a direction X (the left-and-right direction in FIGS. 3A to 3C) of the shear stress and a direction Y (the paper surface direction in FIGS. 3A to 3C) orthogonal to the direction of the shear stress.

In the bent bonding member 60 shown in FIG. 3B, viscosities of two layers of the bending member, which constituting a bonding interface bonded to the TFT substrate 10 and a bonding interface bonded the counter substrate 20, are lower than that of the bending member between these two layers. Since the layer constituting the bonding interface to the TFT substrate 10 is composed of the bonding member having a low viscosity, the bent bonding member 60 is deformed so as to allow the TFT substrate 10 to be greatly shifted in a direction X1 of the shear stress in FIG. 3B. Moreover, since the layer constituting the bonding interface to the counter substrate 20 is composed of the bonding member having a low viscosity, the bent bonding member 60 is deformed so as to allow the counter substrate 20 to be greatly shifted in a direction X2 of the shear stress in FIG. 3B.

In the bent bonding member 60 shown in FIG. 3C, only the layer constituting the bonding interface bonded to the counter substrate 20 is the bonding member having a low viscosity. Therefore, the bent bonding member 60 is greatly deformed at the bonding interface to the counter substrate 20 in the direction X2 of the shear stress in FIG. 3C. On the other hand, the bent bonding member 60 shown in FIG. 3C has a small deformation allowance in the direction of the shear stress in the layer constituting the bonding interface bonded to the TFT substrate 10.

FIGS. 4A and 4B are cross-sectional views showing another example of the configuration of the bent bonding member according to the first embodiment, for explaining deformation of the bent bonding member. The bent bonding member 60 shown in FIGS. 4A and 4B is provided discontinuously in the direction X of the shear stress and continuously in the direction Y orthogonal to the direction of the shear stress. By employing such a configuration, the bent bonding member 60 has a deformation allowance in the direction of the shear stress greater than that of the flat bonding member irrespective of the deformation easiness (degree of viscosity) of the material itself.

As has been described above, the bent bonding member 60 having a great deformation allowance in the direction of the shear stress is employed in the display device 100 according to the first embodiment. Specifically, the bent bonding member 60 is configured such that the deformation allowance thereof in the direction of the shear stress is greater than that of the flat bonding member 50. By employing such a configuration, a stress at the bonding interface in the bent portion of the display device 100 is relieved. As a result, a strain occurring in the bent portion of the display device 100 is reduced.

Figure 5:
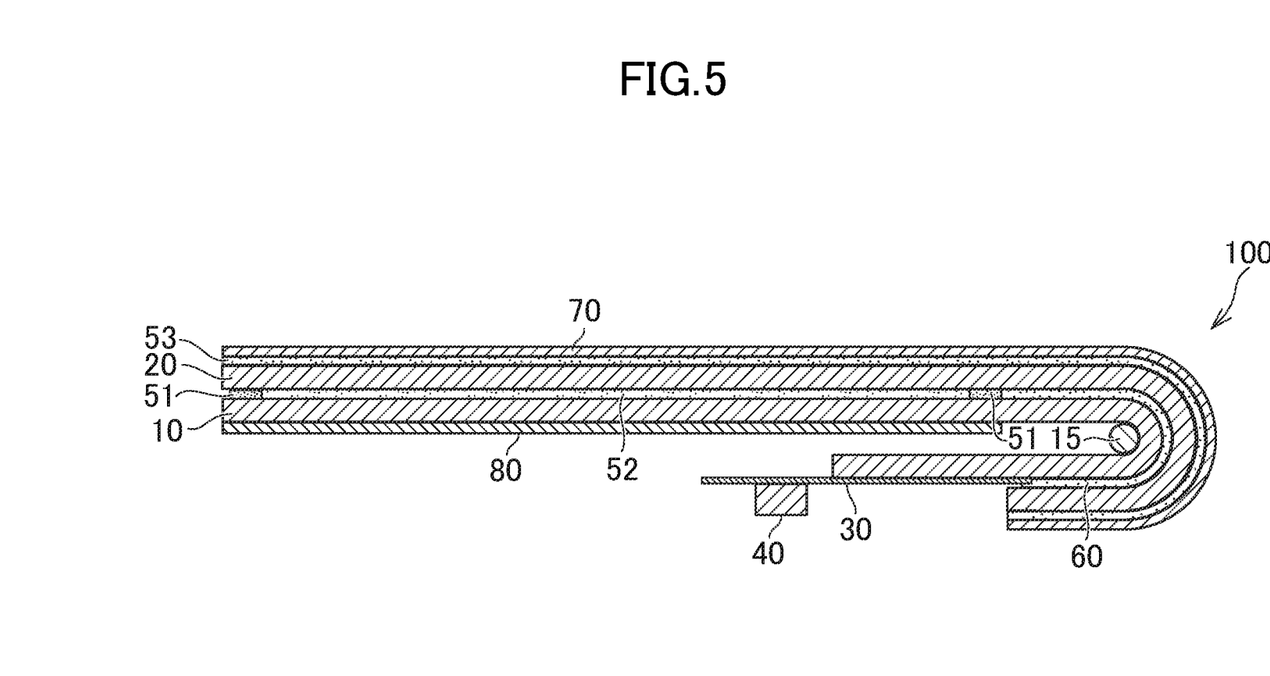
FIG. 5 is a cross-sectional view schematically showing a configuration in which a protective film is provided in the display device according to the first embodiment.

As shown in FIG. 5, the display device 100 according to the first embodiment may be configured to include a protective film 70 on a surface of the counter substrate 20 on the side opposite to the TFT substrate 10 and include a protective film 80 on a surface of the TFT substrate 10 on the side opposite to the counter substrate 20.

The protective film 70 is provided on the outermost surface of the counter substrate 20 in a projecting direction of the bending thereof, so as to cover the additional function area B1 (the display area A1) and the peripheral area B2. However, the protective film 70 is not limited to this, and it is sufficient for the protective film 70 to be provided so as to cover at least the additional function area B1 of the counter substrate 20.

On the outermost surface of the counter substrate 20, a protective bonding member 53 bonding the protective film 70 is provided. In the protective bonding member 53, a shear stress occurs, in the bent portion thereof, at a bonding interface to the counter substrate 20 and a bonding interface to the protective film 70. The protective bonding member 53 is configured so as to be deformable in a direction of the shear stress.

The protective bonding member 53 is configured such that the deformation allowance thereof in the direction of the shear stress is greater than that of the flat bonding member 50 at least a portion where at least one of the bonding interface to the protective film 70 and the bonding interface to the outermost surface of the counter substrate 20 is formed. Therefore, even when the TFT substrate 10, the counter substrate 20, and the protective film 70 are bent after the protective film 70 is bonded to the counter substrate 20, a stress at the bonding interface of the protective film 70 is relieved. As a result, it is possible to suppress the occurrence of a strain in the bent portion of the display device 100 caused by the use of the protective film 70.

The protective film 80 is preferably bonded before bending the TFT substrate 10. Moreover, the protective film 80 preferably has a length that is not present at a portion where the TFT substrate 10 is bent, so as not to affect a process of bending the TFT substrate 10.

Figure 6:
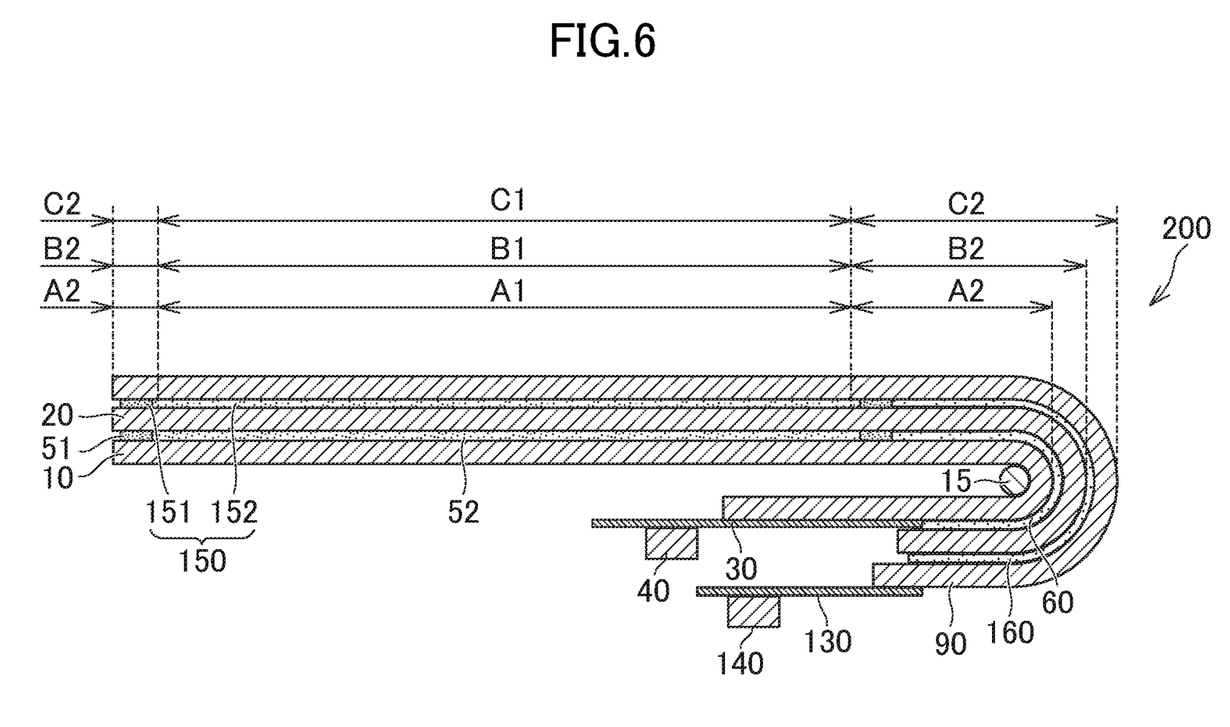
FIG. 6 is a cross-sectional view schematically showing a display device according to a second embodiment.

Next, a display device according to a second embodiment of the invention will be described with reference to FIG. 6. FIG. 6 is a cross-sectional view schematically showing a cross-section of the display device according to the second embodiment.

As shown in FIG. 6, a display device 200 according to the second embodiment further includes, in addition to the configuration of the display device 100 according to the first embodiment shown in FIG. 1, a touch panel 90 as a third substrate and a flexible wiring board 130 as a second flexible wiring board.

The touch panel 90 includes a touch input area C1 provided with a touch input function added to the image display function of the TFT substrate 10, and a peripheral area C2 as a third peripheral area located outside the touch input area C1. The touch panel 90 includes, in the peripheral area C2, a terminal (not shown) for external electrical connection.

The flexible wiring board 130 receives a signal for controlling the touch input function of the touch panel 90, and is electrically connected to the terminal included in the peripheral area C2 of the touch panel 90. Moreover, the flexible wiring board 130 is disposed so as to overlap the flexible wiring board 30. On the flexible wiring board 130, an IC 140 as an electronic component is mounted at a position closer to an edge portion of the flexible wiring board 130 on the side opposite to the side where the flexible wiring board 130 is joined to the touch panel 90 in the longitudinal direction, than a position where the flexible wiring board 130 is joined to the touch panel 90.

The counter substrate 20 and the touch panel 90 are bonded together at the additional function area B1 and the touch input area C1 with a flat bonding member 150 as a second flat bonding member. Moreover, the counter substrate 20 and the touch panel 90 are bonded together at the peripheral area B2 and the peripheral area C2 with a bent bonding member 160 as a second bent bonding member.

The flat bonding member 150 is a member including a sealing material 151 surrounding the additional function area B1 and the touch input area C1, and a filling material 152 provided in an area surrounded by the sealing material 151. The flat bonding member 150 bonds the counter substrate 20 and the touch panel 90 together, or causes the counter substrate 20 and the touch panel 90 to adhere together, so as to maintain the relative positions thereof.

Here, a shear stress occurs at a bonding interface of the bent bonding member 160 to the bent portion of the counter substrate 20 and a bonding interface of the bent bonding member 160 to the bent portion of the touch panel 90. Directions of shear stresses, occurring at the bonding interfaces facing each other, are opposite. Such shear stresses cause a strain in the bent portion of the display device 200.

In the display device 200 according to the second embodiment, therefore, the bent bonding member 160 is provided so as to be deformable in a direction of the shear stress. Therefore, a stress at the bonding interface of the bent bonding member 160 is relieved, and thus a strain occurring in the bent portion of the display device 200 is reduced.

Specifically, in the second embodiment, the bent bonding member 160 is configured such that the deformation allowance thereof in the direction of the shear stress is greater than that of the flat bonding member 150. The bent bonding member 160 is configured in the same manner as the bent bonding member 60 described in the first embodiment, as shown in FIGS. 3A to 3C and FIGS. 4A and 4B. That is, it is sufficient for the bent bonding member 60 to be made of a material having a viscosity lower than that of the flat bonding member 50, or formed continuously in the Y direction and discontinuously in the X direction.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a first substrate having flexibility and including a display area provided with an image display function and a first peripheral area located outside the display area, the first substrate being bent in the first peripheral area;
   a second substrate having flexibility and including an additional function area provided with a function added to the image display function and a second peripheral area located outside the additional function area, the second substrate being bent in the second peripheral area in the same direction as the bending of the first peripheral area;
   a first flat bonding member bonding the first substrate and the second substrate together at the display area and the additional function area, the first flat bonding member including a sealing material provided so as to surround the display area, and a filling material provided in an area surrounded by the sealing material; and
   a first bent bonding member bonding the first substrate and the second substrate together at the first peripheral area and the second peripheral area, the first bent bonding member including a bonding interface at which a shear stress occurs due to the bending of the first substrate and the second substrate, wherein
   the first substrate having thin film transistors and display elements,
   the filling material, the sealing material, the first bent bonding member, and an edge of the first substrate are arranged in this order in the first peripheral area, and
   the first bent bonding member has a deformation allowance in a direction of the shear stress greater than that of the first flat bonding member.

2. The display device according to claim 1, wherein
   the first bent bonding member is provided discontinuously in the direction of the shear stress and continuously in a direction orthogonal to the direction of the shear stress.

3. The display device according to claim 1, wherein
   the first substrate includes, in the first peripheral area, a terminal for external electrical connection,
   the display device further includes a flexible wiring board electrically connected to the terminal and attached to the first substrate, and
   the first bent bonding member covers at least a portion of a connecting portion of the flexible wiring board to the terminal.

4. The display device according to claim 1, further comprising:
   a third substrate having flexibility and including a touch input area provided with a touch input function added to the image display function and a third peripheral area located outside the touch input area, the third substrate being bent in the third peripheral area in the same direction as the bending of the second peripheral area;
   a second flat bonding member bonding the second substrate and the third substrate together at the additional function area and the touch input area; and
   a second bent bonding member bonding the second substrate and the third substrate together at the second peripheral area and the third peripheral area, the second bent bonding member including a bonding interface at which a shear stress occurs due to the bending of the second substrate and the third substrate, wherein
   the second bent bonding member has a deformation allowance in a direction of the shear stress greater than that of the second flat bonding member.

5. The display device according to claim 4, wherein
   the second bent bonding member is provided discontinuously in a direction of the shear stress and continuously in a direction orthogonal to the direction of the shear stress.

6. The display device according to claim 4, wherein
   the third substrate includes, in the third peripheral area, a terminal for external electrical connection, and
   the display device further includes a flexible wiring board electrically connected to the terminal and attached to the third substrate.

7. The display device according to claim 1, further comprising:
   a protective film bonded to an outermost surface in a projecting direction of the bending of the first substrate and the second substrate, so as to cover at least the display area; and
   a protective bonding member bonding the protective film to the outermost surface, wherein the protective bonding member has a deformation allowance in the direction of the shear stress greater than that of the first flat bonding member, at least a portion where at least one of a bonding interface to the protective film and a bonding interface to the outermost surface is formed.

* * * * *